United States Patent [19]

Culp et al.

[11] 4,414,317
[45] Nov. 8, 1983

[54] TRANSPARENCY, A METHOD FOR FORMING IT AND A PHOTOGRAPHIC MASK WHOSE OPTICAL DENSITIES ARE CORRELATED WITH THE CONTOUR OF A SURFACE

[75] Inventors: Charles R. Culp; Larrimore B. Emmons; Walter J. Lewicki, Jr., all of Lancaster, Pa.

[73] Assignee: Armstrong World Industries, Inc., Lancaster, Pa.

[21] Appl. No.: 370,415

[22] Filed: Apr. 21, 1982

[51] Int. Cl.³ .................. B05B 5/00; B65B 33/00; B32B 3/00
[52] U.S. Cl. .................. 430/4; 264/245; 264/246; 264/247; 427/154; 427/161; 428/161
[58] Field of Search ............ 427/154, 5, 6, 161, 427/265, 266; 430/4; 264/245–247, 250; 428/161

[56] References Cited

U.S. PATENT DOCUMENTS

| | | | |
|---|---|---|---|
| 1,548,465 | 8/1925 | Henry | 101/170 |
| 2,854,336 | 9/1958 | Gutknecht | 430/310 |
| 3,711,346 | 1/1973 | Landis | 430/394 |
| 3,775,261 | 11/1973 | Reith et al. | 101/458 |
| 4,084,500 | 4/1978 | Brown et al. | 428/222 |

FOREIGN PATENT DOCUMENTS 56-25733 3/1981 Japan ...................... 430/4

*Primary Examiner*—Michael R. Lusignan

[57] ABSTRACT

Disclosed is a transparency, a method for forming it and a photographic mask having variations in optical density corresponding to deviations of a surface contour from a plane of an original surface. The transparency is a composite two layer, transparent, preferably resinous structure with a contoured interface between the layers. The transparency may be made by forming a first conformed transparent layer on the contoured surface of a substrate. A second conformed transparent layer is then formed on the contoured surface of the first transparent layer. One of said first or second transparent layers is uniformly colored, the other of said layers may be uncolored, or have a less intense, uniform, similar, or different color. Each of the layers has a refractive index substantially equal to that of the other layer at all points. Light may be passed through the transparency in substantially unrefracted rays, and in amounts related to the thickness of the most intensely colored layer. A photographic mask, or plate having variations in optical density corresponding to those of the transparency may be formed by passing light through the transparency onto a film, or plate positioned thereunder.

15 Claims, 12 Drawing Figures

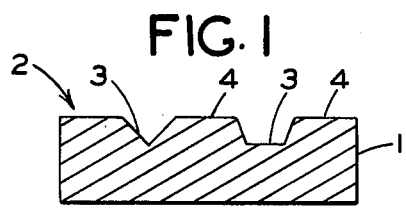
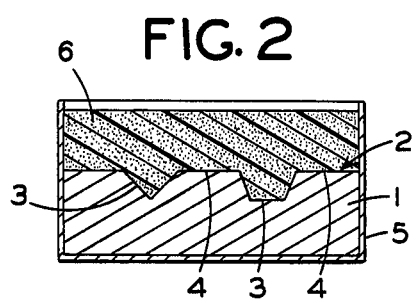
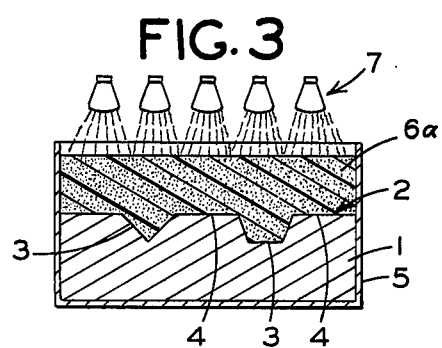
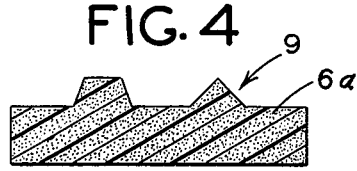
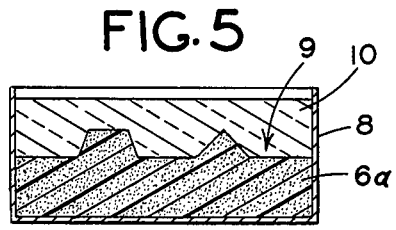
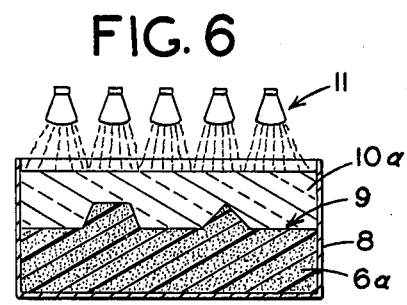
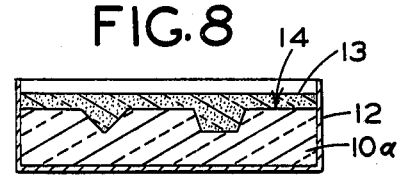
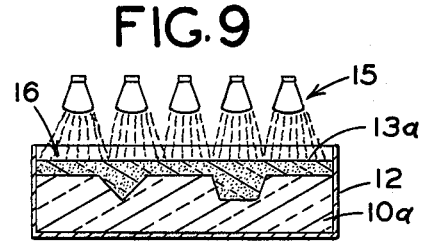
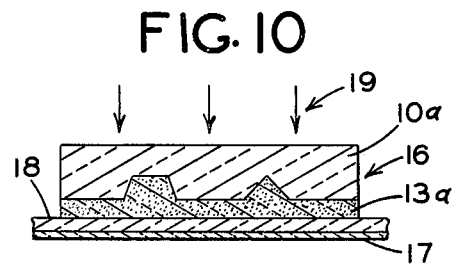

TRANSPARENCY, A METHOD FOR FORMING IT AND A PHOTOGRAPHIC MASK WHOSE OPTICAL DENSITIES ARE CORRELATED WITH THE CONTOUR OF A SURFACE

BACKGROUND OF THE INVENTION

1. Field of the Invention

This invention relates generally to a transparent structure through which light rays may be passed and which is useful to form a photographic mask, or plate, which is ultimately used in connection with known chemical etching processes for forming three-dimensional designs on metal rolls, plates, and the like.

More specifically this invention relates to a two-layer, transparency having variations in optical density corresponding to deviations of a surface contour from a plane of an original surface, a method for forming it, and to the use of the transparency in making a mask or plate having similar variations in optical density after development.

2. Description of Prior Art

In the fabrication of embossing rolls or plates, the replication of a master or original model and the conversion of the replica into a photographic transparency or overlay is an essential part of the fabrication procedures.

It has been known in the past to photograph various decorative patterns and objects having contoured surfaces, and to utilize known photographic and chemical milling techniques to reproduce the configurations of the original surfaces on metal rolls, plates, etc. U.S. Pat. No. 1,548,465 is an example of such a process used for the reproduction of a wood grain on metal surfaces. Another photographic and chemical milling process for producing an embossing cylinder is disclosed by U.S. Pat. No. 3,775,261. U.S. Pat. No. 3,711,346 discloses a method for reproducing a three-dimensional surface configuration in metal by photographing the contoured surface a plurality of times as the light source is elevated a few degrees at a time from a startig position at an angle of 1 to 10 degrees above the plane of the surface. The sets of developed films or masks thus generated are then used in a series of steps to chemically etch the configuration of the original surface in metal. U.S. Pat. No. 2,854,336 relates to a method of forming a two-level photo-engraved embossing plate or mold comprising the use of two different negatives to form a primary design and a background design on metal using known photographic and chemical milling techniques.

The prior art attempts to faithfully reproduce in metal the various three-dimensional contours of an original surface were somewhat less than satisfactory. Primarily this was due to the previous difficulty of obtaining on the developed films or masks, the varying optical densities required to enable the surface contours of an original surface to be replicated on metal by known chemical milling procedures.

SUMMARY OF THE INVENTION

It is an object of the invention to provide a two-layer transparency adapted to be used to produce a photographic mask or plate having varying optical densities correlated with variations of a surface contour from a plane of an original surface.

It is a further object to provide a method for making such a transparency.

It is another object to provide such a transparency having a contoured interface between the two layers which matches the contoured surface of an original surface.

Another object of the invention is to provide such a transparency wherein at least one layer is uniformly colored, and wherein the refractive index of each layer substantially equals that of the other, thus allowing light to pass through the structure in substantially unrefracted rays, and in amounts related to the concentration of color in the transparency.

It is another object of the invention to provide a method using the above mentioned transparency to produce a mask having varying optical densities correlated with the variations of a surface contour from a plane of an original surface.

The present invention is based upon the discovery that variations of a surface contour from a plane of an original surface may be transformed into variations in the optical density of a photographic mask through the formation and use of a two-layer transparency wherein at least one of the layers is uniformly colored, the first layer being a replica of the original surface and the second layer, formed on the contoured surface of the first layer, has a refractive index substantially equal to that of the first layer at all points.

The transparency may be formed by a molding process wherein an uncured resin is applied to an original contoured surface, or a replica thereof, and permitted to cure before removal therefrom. Another layer of uncured resin may be then applied to the contoured surface of the first layer and cured. Both resin layers are transparent when cured, and one of the layers is uniformly colored. The optical density of the composite two-layer structure varies according to the thickness of the colored layer at any given point. Each of the layers has a refractive index equal to that of the other layer at all points. The fact that light may be passed through the transparency in substantially unrefracted rays onto a film or plate enables the variations in the optical density of the transparent structure to be transformed into variations in the optical density of the film or mask, after development. The mask so produced may then be used in the known photographic and chemical milling techniques to reproduce the contours of the original surface on a metal surface.

BRIEF DESCRIPTION OF THE DRAWING

FIG. 1, is a cross sectional view of the original, the surface contour of which is to be duplicated;

FIG. 2, is a cross-sectional view of a mold member, with the original of FIG. 1 therein, and an opaque layer of resinous material on the contoured surface thereof;

FIG. 3, is a cross-sectional view similar to FIG. 2 illustrating the heat curing of the opaque layer;

FIG. 4, is a cross-sectional view of the opaque mirror image copy of the original, produced by the steps shown in FIGS. 1, 2, and 3;

FIG. 5, is a cross-sectional view of a mold member, with the mirror image copy shown in FIG. 4 therein, and an uncolored layer of resinous material on the contoured surface thereof;

FIG. 6, is a cross-sectional view similar to FIG. 5, illustrating the heat curing of the uncolored resinous layer;

FIG. 7, is a cross-sectional view of the uncolored positive replica of the original produced by the steps shown in FIGS. 5 and 6;

FIG. 8, is a cross-sectional view of a mold member, with the uncolored positive replica of FIG. 7 therein, and a dye-containing resinous layer on the contoured surface thereof;

FIG. 9, is a cross-sectional view similar to FIG. 8 illustrating the heat-curing of the dye-containing layer;

FIG. 10, is a cross-sectional view of the two-layer transparent structure formed by the steps shown in FIGS. 8 and 9, positioned on a glass plate over a photographic film or plate.

DESCRIPTION OF THE PREFERRED EMBODIMENT

Figure 11:
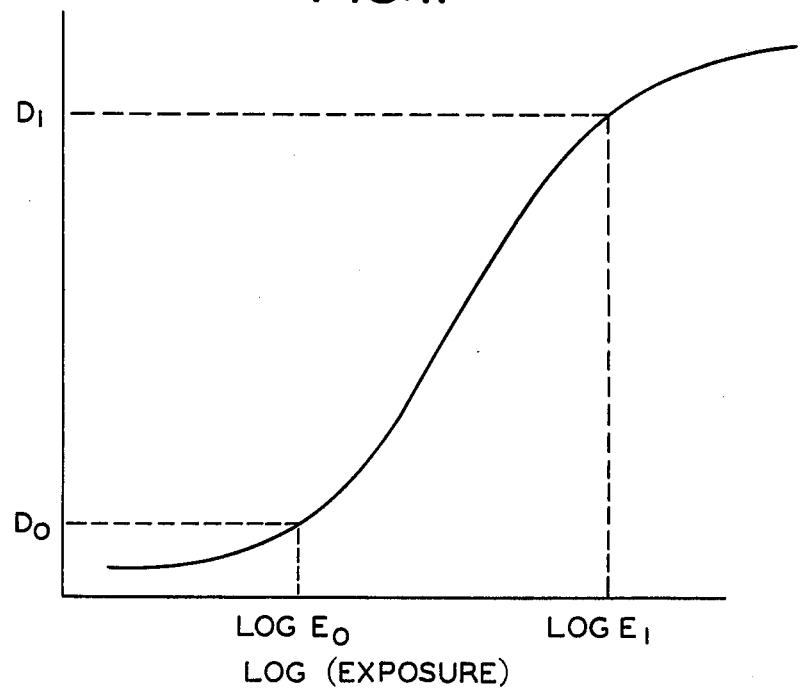
FIG. 11 is a graphic illustration of a characteristic curve of film response as a plot of density D versus logarithm of exposure E.

Referring to the drawings, there is shown in FIG. 1, an original object 1 having a contoured surface 2 with depressed portions 3 and elevated portions 4. As shown in FIG. 2, in the next step in the method of forming the transparency of this invention, the original is placed in a mold or container 5 having inner dimensions such that the contoured surface 2 of the original 1 may be completely covered by a liquified resinous material 6, a layer of which is applied thereto. The resinous material 6 useable to replicate the original surface 2 may be any conventional resinous material preferably in liquid form, such as a one or two part, curable, polymeric material which in its uncured state may be poured or otherwise applied onto the surface 2, and which in its cured state can be removed therefrom in a manner offering minimal disturbance to the integrity of the replica. However, the material 6 could comprise other nonpourable but moldable materials, such as a thick layer of wax, which would replicate the surface 2 under slight heat and/or pressure. Also useable in this invention are photocurable polymers such as those described in U.S. Pat. No. 4,084,500. The cured material 6a (FIG. 4) is a negative replica of the original 1 and may be either rigid or flexible.

The preferred material used in forming the replica 6a is a low viscosity, white, general purpose RTV (Room Temperature Vulcanizable) silicone rubber made by Emerson and Cuming, Inc., Canton, Mass. and sold under the Trademark ECCOSIL 4122. On adding a catalyst supplied by the manufacturer, this material cures at a temperature of from 68° F. (in about 10 hours) to 150° F. (in four hours). Heat-applying means 7 is diagramatically shown in FIG. 3.

As shown in FIGS. 5 and 6, the next step in the method involves the formation of a mirror-image replica 10a (FIG. 7) of the first replica 6a. As in the formation of the first replica 6a, a mold, or container 8 (FIG. 5) is provided. The first replica 6a is placed in the container 8 and a casting of the first replica 6a is formed by pouring onto the surface 9 thereof a layer 10 of uncolored polymeric material which, in its cured state can then be removed from the first replica 6a. The preferred medium used in forming the second replica 10a is an uncolored, two-part epoxy casting resin available from Emerson and Cuming, Inc., Canton, Mass. and sold under the Trademark STYCAST 1269A. A thoroughly blended mixture of equal part of resin and hardener is poured over the surface 9 of the first replica 6a and cured by heat for 16 hours at 190° F. Heat-applying means 11 for effecting the cure is shown diagramatically in FIG. 6. After curing, the uncolored replica 10a, which is a copy of the original 1, is removed from the container 8 and appears as illustrated in FIG. 7.

In the next step of the method, the uncolored replica 10a is placed in a mold or container 12 and a uniformly colored resinous layer 13 is formed on the contoured surface 14 of the clear replica 10a. The same resin, STYCAST 1268A, as that used to form the uncolored replica 10a was used but a red dye solution as supplied by the manufacturer in the proportion of 1 part dye to 10 parts of the epoxy resin was added.

In the next step of the method, as shown in FIG. 9, the colored resious layer 13 is cured by heating means 15 to form the second layer 13a of the two-layer transparency of this invention. Ideally, the replica 10a and the dyed casting 13a should be made of the same polymeric material, and the casting 13a should, in its cured state, adhere to the replica 10a and have a similar refractive index.

The composite transparent structure 16 is then removed from the mold or container 12 and, as illustrated in FIG. 10, may then be placed over a photographic film or plate 17. An optically clear glass plate 18 may be positioned between the transparency 16 and the film or plate 17 to avoid adversely affecting the emulsion 20 thereon. Light from a distant point source, or collimated light, as indicated by the arrows 19 in FIG. 10 is then passed through the transparency 16 to expose the film or plate 17 and transform variations in the thickness of the dyed or darker layer 13a of the transparency 16 into variations in the optical density of the photographic emulsion after development. It will be obvious to those skilled in the art that replica 10a of the transparency 16 can have some color. However, adjustments would be made in the color concentration in 13a and/or the exposure time to achieve the desired results in the photographic mask or plate.

The above-described procedure for forming the transparency is preferred, primarily because it produces first a conventional positive replica (10a) of the original which would be reusable to receive layer 13a, and it does not require that the uncolored resin system be flexible, although flexible resins may be used. However, the formation of the opaque replica 6a may be eliminated and the color-containing replica 13a may be formed directly on the original 1 followed by formation of the uncolored replica 10a by casting the uncolored resin layer 10 on 13a. Liquid silicone rubber compounds such as General Electric RTV 615,655, and 670 which cure at room temperature are examples of materials of this nature found useful in this invention. Also, with the elimination of the opaque replica 6a, a first uncolored layer or, a uniformly colored layer may be formed on a contoured substrate and a liquid may be used for forming a second layer on the contoured surface of the first layer. If the first layer is uncolored, the second layer may be uniformly colored. If the first layer is colored, the second layer may be uncolored, or have a less intense uniform, similar, or different color.

An essential requirement for the success of the method of this invention is the equality of the refractive indices of the uncolored and colored media. The result of an inequality will be the bending of light rays in their passing between the two layers of the transparency, introducing distortions into the photo-replica.

THEORY OF THE METHOD

Figure 12:
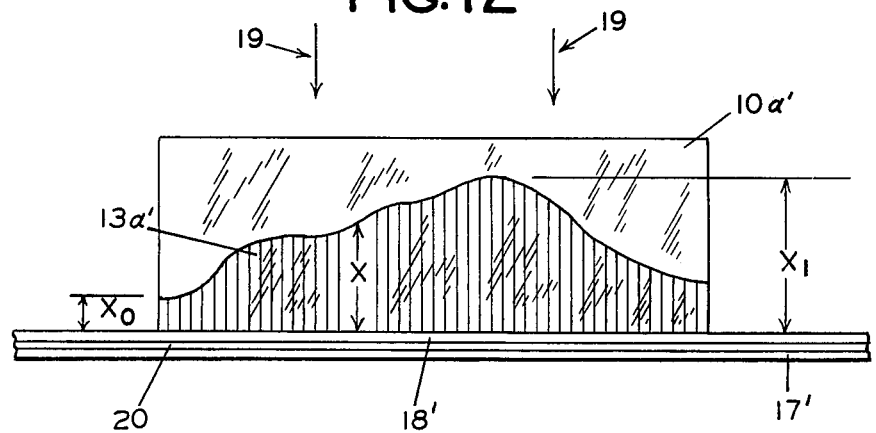
FIG. 12 is a cross-sectional view of a two-layer transparency of this invention, positioned on a glass plate over a photographic film or plate and illustrating the geometry of the exposure process.

FIG. 12 presents the geometry of the exposure process. Rays of light 19 pass through the uncolored layer 10a', the colored layer 13a', and glass plate 18', to expose the film 17' having the emulsion 20 thereon. Attenuation of the light rays depends only on the thickness of colored layer 13a' traversed thereby. If no refraction (bending) of the light rays 19 occurs at the interface between the uncolored and colored layers, then the exposure of a point on the film depends only on the thickness of the colored layer 13a' directly overhead. The transmittance T of the photoreplica at a point where the colored thickness is X can be described by the relation $$\frac{\log T - \log T_o}{\log T_1 - \log T_o} = \frac{X - X_o}{X_1 - X_o}$$

$X_o$ = the minimum colored thickness giving maximum transmittance $T_o$, and $X_1$ = the maximum colored thickness giving minimum transmittance $T_1$.

FIG. 11 shows the traditional method of characterising film response as a plot of density D versus the logarithm of the exposure E.

Density = $-\mathrm{Log}_{10}$ (transmittance)
Exposure = Incident radiant energy per unit area.

There is a range of exposures ($E_o$ to $E_1$) where the density can be represented as a linear approximation to log E.

$$D = D_o + (D_1 - D_o) \frac{\log E - \log E_o}{\log E_1 - \log E_o}$$

$E_o$, $E_1$ and $D_o$, $D_1$ are the respective exposures and densities which define the linear region on the characteristic curve. It is in this linear region that variations in T are recorded in an optimal fashion.

To record the full range of transmittances ($T_1$ to $T_o$) in the photoreplica onto the film's linear region one requires that $E_o = T_1 H_t$ and $E_1 = T_o H_t$ where H is the irradiance of the top surface of the photoreplica and t is the exposure time. Under these conditions the film density and the colored thickness are related by the relation $$D = D_o + (D_1 - D_o) \frac{X - X_o}{X_1 - X_o}$$

which shows the film density to be linearly related to the contour of the original object.

IMPLEMENTATION OF THE METHOD

The first procedure will be the calibration of the dyeing operation. The optical density D of a transparent plane parallel plate of thickness d containing a concentration c of dye is D = a c d where a is the absorptivity of the dye and is independent of the concentration and thickness. The absorptivity of the dye can be measured by standard procedures, as set forth in "Chemical Infrared Spectroscopy," by W. J. Potts, Jr., Volume 1, Chapter 6 (John Wiley & Sons, Inc., New York, N.Y. 1963), using the above relation.

This may then be used to compute the optimum concentration of dye, $C_{dye}$ for the photoreplica. Thus $$C_{dye} = \frac{1}{a(X_1 - X_o)} \log_{10} \frac{E_1}{E_o}$$

where $X_O$, $X_1$, $E_O$, and $E_1$ are defined in an earlier section.

Once the dye concentration has been determined one may proceed with the set of steps shown in FIGS. 1 through 10 of the drawings, and described in the preferred embodiment of this invention.

What is claimed is:

1. A method for forming a transparency adapted to be used in a photo-resist and etching process, comprising:
    (a) providing a substrate, having a contoured surface;
    (b) forming a first conformed transparent layer on the contoured surface of the substrate to produce a sheet having one planar surface and one contoured surface;
    (c) removing the first transparent layer from the substrate;
    (d) forming a second conformed transparent layer on the contoured surface of said first transparent layer to form a composite two-layer transparency having substantially parallel, planar top and bottom surfaces, and a contoured interface therebetween, one of said first or second transparent layers being uniformly colored, the other of said layers being uncolored, or having a less intense, uniform, similar, or different color, each of said layers having a refractive index substantially equal to that of the other layer at all points, thus allowing light to enter and exit the two-layer transparency in a direction substantially perpendicular to its top and bottom surfaces in substantially unrefracted parallel rays, with the amount of light transmitted therethrough being related to the variations in thickness of the most intensely colored layer.

2. The method for forming a transparency according to claim 1, wherein the first conformed transparent layer formed on the contoured surface of the substrate is the one that is uniformly and most intensely colored.

3. The method for forming a transparency according to claim 1, wherein the second conformed transparent layer formed on the contoured surface of the first transparent layer is the one that is uniformly and most intensely colored.

4. The method of forming a transparency according to claim 1 wherein the second conformed layer comprises a liquid.

5. The method for forming a transparency according to claims 1, 2, or 3 wherein at least one of the transparent layers is formed of a nonpourable, moldable material.

6. The method for forming a transparency according to claims 1, 2, or 3 wherein a resinous material is used to form the first and second transparent layers.

7. The method according to claim 6, wherein the first layer of the transparency is formed by applying a liquified resinous material to the contoured surface of the original substrate and setting the resin prior to removal therefrom, and wherein a liquified resinous material is applied to the contoured surface of the first layer and set.

8. The method according to claim 6 wherein one of the resinous layers is uncolored after curing.

9. A method for preparing a photographic mask for use in a photo-chemical etching process, comprising:
    (a) forming a two-layer transparency by the methods of either claims 1, 2, 3, or 4;
    (b) placing the transparency over a photographic film or plate;
    (c) passing light through the transparency to provide an exposed film or plate; and
    (d) developing the exposed film or plate to produce a mask having variations in optical density corresponding to the variations in the amount of light transmitted through the transparency and to variations in the contour of an original surface.

10. The method according to claim 9 wherein the material used for forming one of the layers of the transparency is a nonpourable, moldable material.

11. The method for preparing a photographic film according to claim 9 wherein a resinous material is used to form at least one of the layers of the transparency.

12. The method according to claim 11 wherein said uncolored or less intensely colored layer is a resinous material.

13. A transparency adapted to be used in a photoresist and etching process, comprising a composite two-layer structure having substantially parallel, planar top and bottom surfaces and a contoured interface therebetween both layers being transparent, one of said layers being uniformly colored, the other of said layers being uncolored or having a less intense uniform, similar, or different color, each of said layers having a refractive index substantially equal to that of the other layer at all points, whereby light may be passed through the transparency in a direction substantially perpendicular to its top and bottom surfaces in substantially parallel unrefracted rays, with the amount of light transmitted therethrough being related to the variations in thickness of the most intensely colored layer.

14. A transparency according to claim 13 wherein both of said layers are formed of resinous material.

15. A transparency according to claim 13 wherein one of the resinous layers is uncolored after curing.

* * * * *